US009837415B2

(12) United States Patent
Balakrishnan et al.

(10) Patent No.: US 9,837,415 B2
(45) Date of Patent: Dec. 5, 2017

(54) FINFET STRUCTURES HAVING SILICON GERMANIUM AND SILICON FINS WITH SUPPRESSED DOPANT DIFFUSION

(71) Applicant: INTERNATIONAL BUSINESS MACHINES CORPORATION, Armonk, NY (US)

(72) Inventors: Karthik Balakrishnan, White Plains, NY (US); Kangguo Cheng, Schenectady, NY (US); Pouya Hashemi, White Plains, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 96 days.

(21) Appl. No.: 14/750,455

(22) Filed: Jun. 25, 2015

(65) Prior Publication Data

US 2016/0379981 A1     Dec. 29, 2016

(51) Int. Cl.
*H01L 27/092*     (2006.01)
*H01L 21/8238*   (2006.01)
(Continued)

(52) U.S. Cl.
CPC .. *H01L 27/0924* (2013.01); *H01L 21/823807* (2013.01); *H01L 21/823821* (2013.01);
(Continued)

(58) Field of Classification Search
CPC ........... H01L 29/66795; H01L 29/7849; H01L 21/823892
See application file for complete search history.

(56) References Cited

U.S. PATENT DOCUMENTS 7,510,916 B2   3/2009   Chu
7,547,930 B2   6/2009   Chu
(Continued)

FOREIGN PATENT DOCUMENTS

CN     10193793 A  *  8/2010
CN     101937931 A     1/2011
(Continued)

OTHER PUBLICATIONS

Applicants admitted prior art given in FIGs 5-8 and specification p. 2 lines 5-19 of this application.*
(Continued)

*Primary Examiner* — Samuel Gebremariam
*Assistant Examiner* — Jonas T Beardsley
(74) *Attorney, Agent, or Firm* — Louis J. Percello, Esq.; Otterstedt, Ellenbogen & Kammer, LLP

(57) ABSTRACT

A finned structure is fabricated using a bulk silicon substrate having a carbon-doped epitaxial silicon germanium layer. A pFET region of the structure includes fins having silicon germanium top portions and an epitaxial carbon-doped silicon germanium diffusion barrier that suppresses dopant diffusion from the underlying n-well into the silicon germanium fin region during device fabrication. The structure further includes an nFET region including silicon fins formed from the substrate. The carbon-doped silicon germanium diffusion barrier has the same or higher germanium content than the silicon germanium fins.

20 Claims, 2 Drawing Sheets

(51) Int. Cl.
*H01L 29/78* (2006.01)
*H01L 29/66* (2006.01)

(52) U.S. Cl.
CPC .. *H01L 21/823892* (2013.01); *H01L 27/0928* (2013.01); *H01L 29/66795* (2013.01); *H01L 29/7849* (2013.01)

(56) References Cited

U.S. PATENT DOCUMENTS

| | | | |
|---|---|---|---|
| 7,563,657 B2 | 7/2009 | Chu | |
| 2006/0172476 A1* | 8/2006 | Liao | H01L 29/785 |
| | | | 438/197 |
| 2006/0220112 A1 | 10/2006 | Zhu | |
| 2007/0096149 A1* | 5/2007 | Liu | H01L 21/823807 |
| | | | 257/192 |
| 2009/0291540 A1* | 11/2009 | Zhang | H01L 21/823807 |
| | | | 438/229 |
| 2013/0320429 A1* | 12/2013 | Thomas | H01L 29/66712 |
| | | | 257/329 |
| 2014/0061820 A1* | 3/2014 | Reznicek | H01L 21/823821 |
| | | | 257/401 |
| 2014/0191335 A1 | 7/2014 | Yin | |
| 2014/0339643 A1 | 11/2014 | Cheng | |
| 2015/0311341 A1* | 10/2015 | Hur | H01L 21/02532 |
| | | | 257/190 |

FOREIGN PATENT DOCUMENTS

| | | |
|---|---|---|
| CN | 101937931 B | 10/2012 |
| WO | WO 00/24043 A1 | 4/2000 |

OTHER PUBLICATIONS

Applicant's admitted prior art given in FIGs 5-8 and specification p. 2 lines 5-19 of this application.*
English translation of CN 101937931A.
English translation of CN 101937931B.
English translation of WO 00/24043.

* cited by examiner

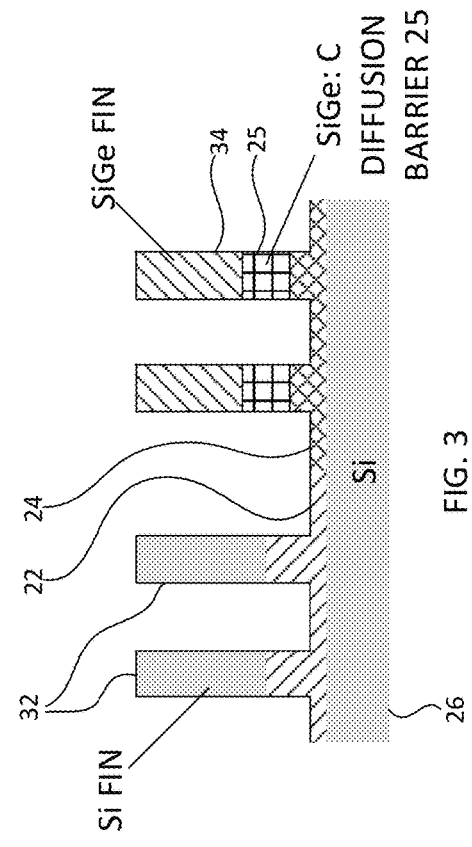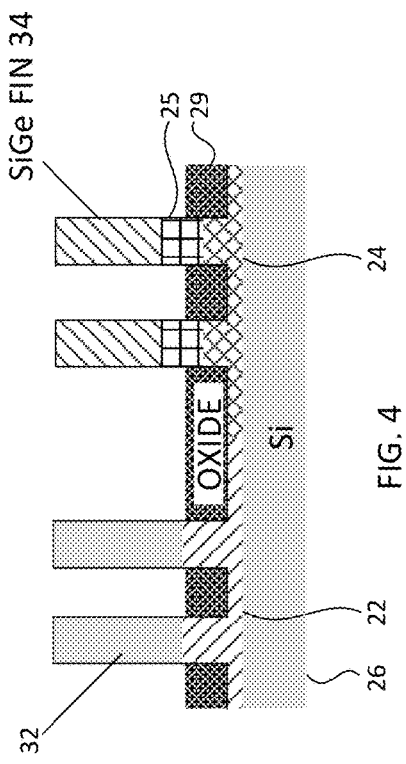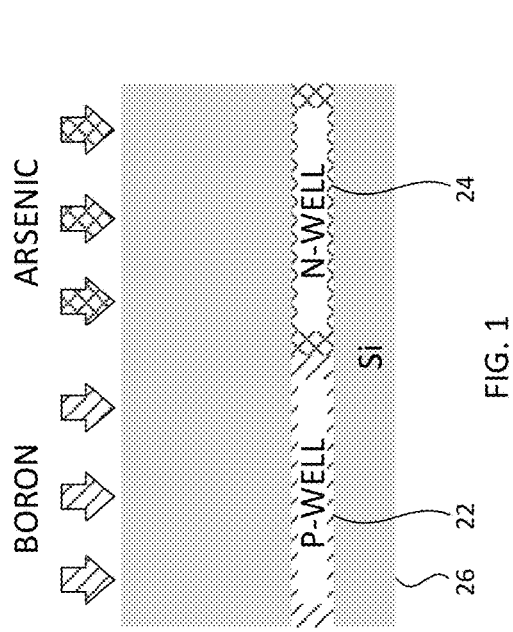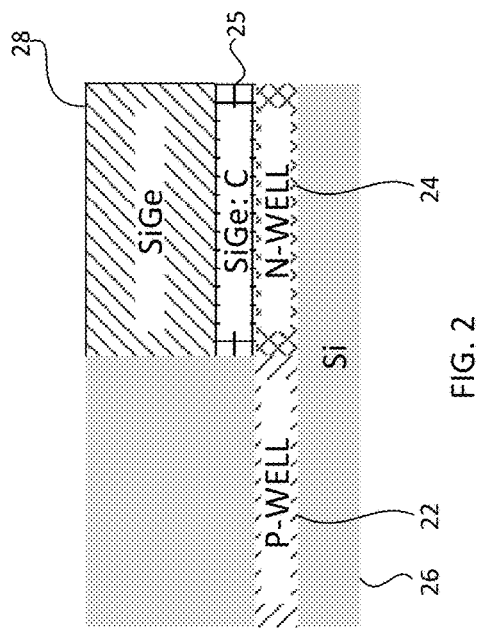

FINFET STRUCTURES HAVING SILICON GERMANIUM AND SILICON FINS WITH SUPPRESSED DOPANT DIFFUSION

FIELD

The present disclosure relates to the physical sciences, and, more particularly, to fin-type field effect transistor (FinFET) structures and methods of fabrication thereof.

BACKGROUND

Some types of field effect transistors (FETs) have three-dimensional, non-planar configurations including fin-like structures extending above substrates. Such field effect transistors are referred to as FinFETs. The substrates may include semiconductor on insulator (SOI) substrates or bulk semiconductor substrates. Silicon fins are formed in some FinFETs on substrates via known technology such as sidewall image transfer (SIT). FinFET structures including SOI substrates can be formed, in part, by selectively etching the crystalline silicon layers down to the oxide or other insulating layers thereof following photolithography. Active fin heights are set by SOI thickness when employing SOI substrates. In bulk FinFETs, active fin height is set by oxide thickness and etched fin height. The gates of FinFETs can be formed using a "gate-first" process wherein a gate stack and spacers are formed prior to selective epitaxial growth wherein source and drain regions are enlarged. A "gate-last" process may alternatively be employed wherein the source/drain regions are formed immediately following fin patterning. Gate-last procedures can involve making a dummy gate, fabricating other elements of the transistor, removing the dummy gate, and replacing the removed dummy gate with actual gate materials.

Doped semiconductor material may be provided by selective epitaxial growth on the sidewalls of the fin structure(s) during fabrication of FinFETs. Such growth results in faceted structures that, in some cases, merge into a continuous volume. Annealing during the fabrication of FinFETs can cause dopants to diffuse into regions where such dopants are not desired.

Silicon germanium fins are employed in some p-type FinFET devices. Fabrication of silicon germanium fins may include growing a layer of silicon germanium on a silicon substrate and cutting fins from the silicon germanium layer. Fins are also cut from an adjoining silicon layer to form an nFET region. To isolate the silicon germanium fins, a well implant is provided to create an oppositely doped sub-layer that functions as a punch through stop (PTS).

A p-well 22 and an n-well 24 are formed by ion implantation of boron and arsenic, respectively, within a silicon substrate 26. If a structure including both silicon and silicon germanium fins is to be fabricated, a recess is formed in the pFET region of the structure followed by deposition of a silicon germanium layer 28. The structure 50 shown in FIG. 5 is thereby obtained. Using known techniques for cutting fins, such as photolithography or sidewall image transfer, silicon fins 32 are formed in the nFET region and silicon germanium fins 34 are formed in the pFET region, as shown in FIG. 6. Subsequent thermal processing of the structure 60 shown in FIG. 6, as employed using conventional CMOS fabrication techniques, includes annealing. As shown in FIG. 7, dopants 24A (e.g. arsenic) from the n-well diffuse up the silicon germanium fins and contaminate the pFET region. This is less of a problem if silicon fins are used in the pFET region as arsenic does not diffuse as fast in silicon as it does in silicon germanium. Phosphorus, another n-type dopant having a higher diffusion coefficient than arsenic, would contaminate the pFET region even more than arsenic. An oxide layer 29 is formed on the substrate 26 to provide electrical isolation.

SUMMARY

Principles of the present disclosure provide an exemplary fabrication method that includes obtaining a first structure comprising a crystalline silicon substrate having an nFET region and a pFET region, a p-well region within the nFET region of the substrate and an n-well region within the pFET region of the substrate. A recess is formed within the pFET region of the crystalline silicon substrate down to the n-well region, a carbon-doped silicon germanium layer is epitaxially grown on the n-well region, and a silicon germanium layer is epitaxially grown on the carbon-doped silicon germanium layer. A plurality of parallel first fins comprising a silicon germanium portion from the silicon germanium layer, a carbon-doped silicon germanium portion from the carbon-doped silicon germanium layer, and an n-doped portion from part of the n-well region are formed in the pFET region. A plurality of parallel second fins comprising a silicon portion from the crystalline silicon substrate and a p-doped portion from the p-well region are formed in the nFET region.

A finned structure in accordance with an exemplary embodiment includes a silicon substrate, a p-well region within a first region of the substrate, and an n-doped n-well region within a second region of the substrate. The finned structure further includes a plurality of first fins. Each first fin has a silicon germanium top region and an epitaxial carbon-doped silicon germanium region between the silicon germanium top region and the n-doped n-well. A plurality of parallel second fins each have a silicon portion adjoining the p-well region. A dielectric layer on the substrate electrically isolates the first fins and the second fins.

As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed. For the avoidance of doubt, where an actor facilitates an action by other than performing the action, the action is nevertheless performed by some entity or combination of entities.

FinFET structures and fabrication methods as disclosed herein can provide substantial beneficial technical effects. For example, one or more embodiments may provide one or more of the following advantages:

Suppression of well dopant diffusion into silicon germanium channel regions;
   Different channel materials for nFET and pFET devices so nFET and pFET characteristics can be independently optimized.

These and other features and advantages will become apparent from the following detailed description of illustrative embodiments thereof, which is to be read in connection with the accompanying drawings.

BRIEF DESCRIPTION OF THE DRAWINGS

FIG. 1 is a schematic illustration of a bulk silicon substrate being subjected to ion implantation to form n-well and p-well regions;

FIG. 2 is a schematic illustration showing a structure obtained following recessing of the silicon substrate and deposition of a carbon-doped silicon germanium layer on the surface of the n-well region and a silicon germanium layer on the carbon-doped silicon germanium layer;

FIG. 3 is a schematic illustration of the structure of FIG. 2 following fin formation;

FIG. 4 is a schematic illustration of the structure of FIG. 3 following thermal processing;

DETAILED DESCRIPTION

Figure 5:
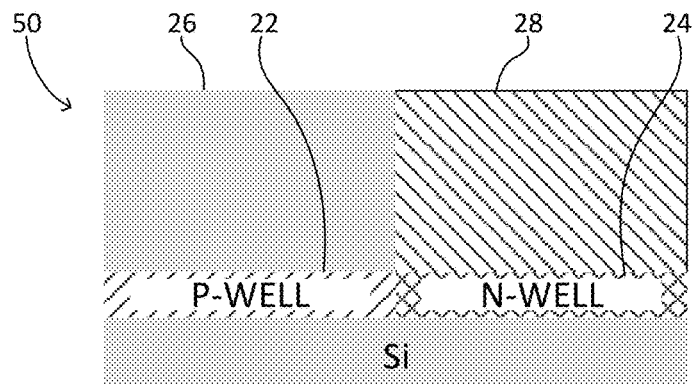
FIG. 5 is a schematic illustration showing a structure obtained following recessing of a silicon substrate and deposition of a silicon germanium layer on the surface of an n-well region.
Figure 6:
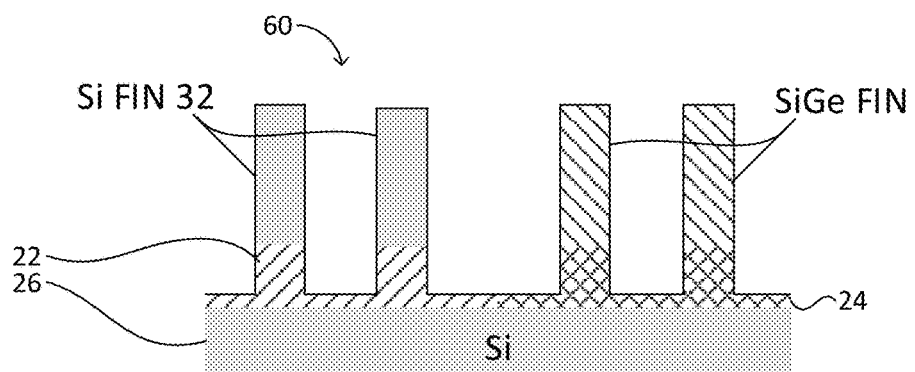
FIG. 6 is a schematic illustration of the structure of FIG. 5 following fin formation.

FinFET structures are characterized by fins formed on semiconductor substrates. Such substrates include bulk silicon substrates (fin on bulk) and SOI substrates (fin on SOI) as discussed above. The processes discussed below are applicable to fabrication of FinFET structures from bulk substrates where sets of fins comprising silicon and silicon germanium are desired. FIGS. 1-4 schematically illustrate exemplary steps that may be performed sequentially in fabricating a structure, it being appreciated that additional steps may be necessary depending on the desired features of the structure. Fabrication may commence with a partially completed structure, in which case one or more of the steps described below could be omitted.

A bulk substrate 26 comprised of essentially undoped crystalline silicon is shown in FIG. 1, it being appreciated that standard silicon substrates may have a very low level of p-doping. The substrate may be in the form of a monocrystalline wafer. A p-type dopant such as boron is implanted in the nFET region of the substrate to form a p-well region 22. An n-type dopant such as arsenic is implanted in the pFET region to form an n-well region 24 in the silicon substrate. As used herein, "n-type" refers to the addition of impurities such as arsenic that contribute free electrons to an intrinsic semiconductor such as silicon. The ion energy range is such that the n-well and p-well regions are formed at a depth between 50-120 nm from the top surface and have a thickness between 100-300 nm. The structure is annealed following ion implantation.

Referring to FIG. 2, a recess is formed in the pFET region of the substrate. The recess can be formed in the structure by reactive ion etching (RIE) down to the n-well region 24 in the substrate 26. Patterning techniques familiar to those skilled in the art facilitate recess formation. Recessing the substrate also cuts off the ion implantation tail above the n-well region 22. In one exemplary embodiment, a hard mask (not shown) is formed over the silicon substrate 26. A nitride (silicon nitride ($Si_3N_4$)) hard mask is employed in one or more embodiments. Such a mask may be deposited using conventional deposition techniques such as spin-on coating, CVD, plasma-assisted CVD, or other known techniques. A soft (for example, photoresist) mask (not shown) is deposited on the hard mask to facilitate selective removal of the portion of the hard mask on the pFET region of the structure. Conventional processes are further employed, such as patterning the resist, etching, and removing resist, to remove a portion of the hard mask from the region of the structure to be used as a pFET region. A surface of the silicon substrate 26 is accordingly exposed in the pFET region of the structure by an opening formed in the hard mask. Hot phosphoric acid is an exemplary etchant that may be employed to form the opening in the nitride hard mask. The recess is extended down to the p-well 24, as shown in FIG. 2. Reactive ion etching (RIE) through the opening in the hard mask is employed in one or more exemplary embodiments.

While the nFET region remains protected by a mask (not shown), a carbon doped silicon germanium (SiGe:C) layer 25 is deposited epitaxially, for example via chemical vapor deposition (CVD), on the surface of the p-well region 24. The thickness of the SiGe:C layer is two to five nanometers (2-5 nm) in one or more exemplary embodiments. The deposited material has an atomic carbon concentration of between about $1 \times 10^{19}$ $cm^{-3}$ to $2 \times 10^{20}$ $cm^{-3}$, although higher or lower doping levels would also work in some exemplary embodiments. In other embodiments, the layer 25 has a concentration of about $5 \times 10^{19}$ $cm^{-3}$. In some embodiments, arsenic is added in situ during epitaxial growth of the SiGe:C layer 25 to extend the punch through stop (PTS). During the epitaxial growth the concentration of dopant precursor Arsine ($AsH_3$) is reduced until completely removed, creating an in situ doped graded SiGe:C(As) layer that extends above the later-deposited oxide layer and is electrically disconnected from the active channel region of the subsequently formed FinFET device. Referring again to FIG. 2, an essentially undoped silicon germanium layer 28 is deposited epitaxially, for example by CVD, on the carbon-doped silicon germanium layer 25. Precursor gases such as silane and germane are employed in some embodiments for forming the epitaxial silicon germanium layer 28. The carbon-doped silicon germanium layer 25 has the same or higher percentage of germanium as the silicon germanium layer 28 formed thereon. In some embodiments, the carbon-doped silicon germanium layer 25 contains 20-80% germanium, though more preferably 20-60% germanium to minimize or avoid potential crystal defects in the resulting structure. In other embodiments, the layer 25 contains 25-50% germanium. Interstitial carbon compensates for some of the strain of the later-formed silicon germanium fins. To maintain the same strain level in the SiGe:C/SiGe block structure shown in FIG. 2, the SiGe:C layer 25 should have one to five percent (1-5%) more germanium than the silicon germanium layer 28. The thickness of the silicon germanium layer 28 in one or more embodiments is between twenty and eighty nanometers (20-80 nm). As will be appreciated from the discussion below, the silicon germanium layer 28 should have sufficient thickness and sufficient germanium content that fins formed in the pFET region of the resulting structure contain an acceptable ratio of silicon and germanium for the intended pFET applications.

Referring to FIG. 3, silicon fins 32 are formed in the nFET region and silicon germanium-containing fins 34 are formed in the pFET region. The silicon germanium-containing fins 34 are formed in the pFET region of the structure from the silicon germanium layer 28 and the underlying SiGe:C and n-well layers. The silicon fins 32 are formed primarily from the bulk silicon substrate 26 in the nFET region of the structure and partially from the p-well region 22. Techniques for forming finned structures for use in FinFET devices are known to the art and continue to be developed. Sidewall image transfer (SIT) is one exemplary and conventional technique for defining fin thickness. Fin thickness is between six and ten nanometers in some embodiments. The carbon-doped silicon germanium layer 25 within the fins 34 functions as a diffusion barrier as discussed below. The nFET and pFET regions comprising the fins 32, 34 are electrically isolated by a shallow trench isolation (STI) region (not shown) that is formed during the fabrication process. A trench (not shown) is formed in the structure, for example by reactive ion etching, down to the substrate 26. Patterning techniques familiar to those skilled in the art facilitate trench formation and subsequent filling of the trench with one or more electrically insulating material(s) such as silicon dioxide. Shallow trench isolation (STI) provides a region that electrically isolates active areas of the structure.

Technology for forming pFET and nFET devices on finned structures as shown in FIG. 3 is known and continues to be developed. The gates of FinFETs can be formed using a "gate-first" process wherein a gate stack and spacers are formed prior to selective epitaxial growth on the fins wherein source and drain regions are enlarged. A "gate-last" process may alternatively be employed. Gate-last procedures can involve making a dummy gate, fabricating other elements of the transistor, removing the dummy gate, and replacing the removed dummy gate with actual gate materials. Device formation typically includes one or more thermal processing steps that, in the absence of the diffusion barrier as disclosed herein between the doped n-well 24 and the silicon germanium fins 34, would cause unwanted diffusion of dopants such as arsenic into the silicon germanium fins.

Doped semiconductor material may be provided by selective epitaxial growth on the sidewalls of the fin structure(s) during fabrication of FinFET devices. Such growth results in faceted structures that, in some cases, merge into a continuous volume. If a gate-first process is employed, gate materials may comprise a gate dielectric (e.g., high-k material such as hafnium oxide) and a gate conductor (e.g., metal gate). Any suitable deposition technique can be used to deposit high-k and metal gate, including but not limited to atomic layer deposition, chemical vapor deposition, physical vapor deposition, sputtering, plating, etc. Gate material can be formed both above and between the fins in some embodiments or, alternatively, only between the fins. Dielectric spacers are formed around the gate structure. If a gate-last process is employed, a dummy gate (not shown) is formed wherein the dummy gate may comprise a dummy gate dielectric (e.g., oxide) covering fins and a dummy gate material (e.g., polysilicon) on top of the dummy gate dielectric. This dummy gate is removed in a later process familiar to those of skill in the art and a replacement metal gate composition is patterned at an appropriate stage of the transistor fabrication process. Fin heights, widths and spacing are further chosen in accordance with manufacturer preferences. Fin heights in some embodiments range between 20-80 nm. Fin heights in the nFET region correspond to the thickness of the silicon layer above the p-well 22, from which they are mostly formed. The side walls of the crystalline silicon fins 32 and silicon germanium-containing fins 34 are (110) surfaces in one or more embodiments. The side walls of the fins 32, 34 may or may not be exactly vertical, and may converge towards the tops of the fins. Surfaces described as (110) surfaces herein are at least close to being (110) surfaces but may or may not be exactly (110) surfaces.

Once obtaining the structure as described above with respect to FIG. 3 and gate structures have been formed thereon, source/drain regions are formed on the fins by diffusion, implantation or other techniques familiar to those of skill in the art. In some embodiments, a layer (not shown) of doped material (for example, silicon germanium) may be grown epitaxially or otherwise deposited on the structure, causing the source/drain regions to be merged in some embodiments or form diamond-shaped, unmerged structures in other embodiments. In the fabrication of a pFET structure in the pFET region, boron-doped SiGe can be employed in one or more embodiments for the epitaxial growth of volumes (not shown) on the sidewalls of the silicon germanium-containing fins 34. To fabricate nFET structures, volumes are formed with phosphorus-doped silicon (Si:P) in some embodiments on the sidewalls of the silicon fins 32. The doping can be chosen as desired for particular transistor applications. In one exemplary embodiment where the doped source/drain semiconductor material is SiGe, the dopant is boron in a concentration ranging 4-7e20 and the resulting FinFET structure is p-type. Further fabrication steps are performed, some of which depend on the particular FinFET structure to be obtained. Typically the grid comprising the parallel fins and gate structures are filled with a low k dielectric material 29. Depending on the type of gate processing employed (gate-first or gate-last), appropriate steps are also taken to complete gate fabrication.

Referring to FIG. 4, the areas between the fins 40 are filled with a dielectric material 29 such as an oxide (for example silicon dioxide ($SiO_2$)), forming isolation regions. Such material can be deposited in accordance with conventional techniques such as high plasma density deposition. The thicknesses of the isolation regions above the n-well and p-well regions 22, 24 can be engineered by oxide fill, then CMP (chemical mechanical planarization) to the top of the gate nitride cap (not shown), and then timed recess RIE (reactive ion etch). As shown in FIG. 4, a portion of the SiGe:C region 24 extends above the oxide layer. If this region 24 is doped with arsenic, the punch through stop may also extend above the oxide layer.

Figure 7:
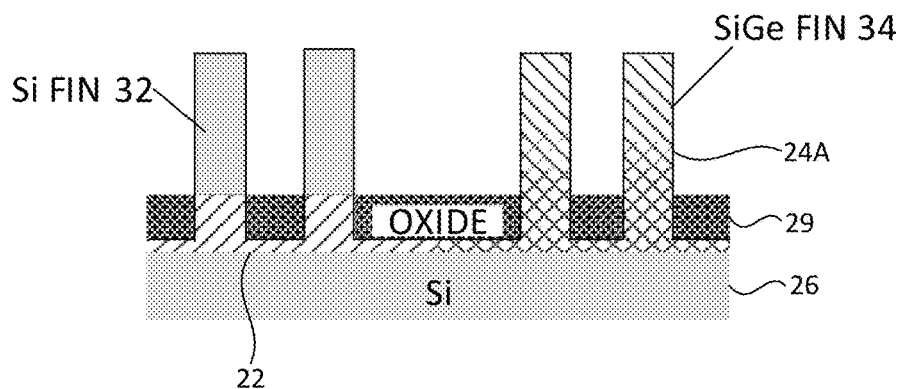
FIG. 7 is a schematic illustration of the structure of FIG. 6 following thermal processing.

Given the discussion thus far and with reference to the exemplary embodiments discussed above and the drawings, it will be appreciated that, in general terms, an exemplary fabrication method includes obtaining a first structure comprising a crystalline silicon substrate 26 having an nFET region and a pFET region, a p-well region 22 within the nFET region of the substrate and an n-well region 24 within the pFET region of the substrate. A recess is formed within the pFET region of the crystalline silicon substrate down to the n-well region 24, a carbon-doped silicon germanium layer 25 is grown on the n-well region 24, and a silicon germanium layer 28 is grown on the carbon-doped silicon germanium layer. A structure as schematically illustrated in FIG. 2 is accordingly obtained. A plurality of parallel first fins 34 comprising a silicon germanium portion from the silicon germanium layer 28, a carbon-doped silicon germanium portion from the carbon-doped silicon germanium layer 25, and an n-doped portion from part of the n-well region 24 are formed in the pFET region, as shown in FIG. 3. A plurality of parallel second fins 32 including a silicon portion from the crystalline silicon substrate 26 and a p-doped portion from the p-well region 22 are formed in the nFET region. A dielectric layer 29 is deposited on the substrate for isolating the first fins and the second fins to obtain the structure shown in FIG. 4. The carbon-doped silicon germanium portions of the first fins 34 extend above the dielectric layer in one or more embodiments, as shown in FIG. 4. In some embodiments, the carbon-doped silicon germanium layer is also doped with arsenic. Once the structure shown in FIG. 4 is obtained, further FinFET fabrication techniques may include thermally processing (e.g. annealing) the structure, wherein the carbon-doped silicon germanium portions of the first fins 34 suppress arsenic diffusion into the silicon germanium portions of the first fins. FIG. 4 schematically illustrates such suppression with FIG. 7 provided for comparison. The steps of growing the carbon-doped silicon germanium layer and the silicon germanium layer are conducted such that the carbon-doped silicon germanium layer 25 has a higher percentage of germanium than is contained in the silicon germanium layer 28 in some embodiments. The step of growing the carbon-doped silicon germanium layer 25 further includes causing the carbon-doped silicon germanium layer 25 to have a composition of $Si_{1-x}Ge_x:C$ where x is at least 0.2. and the atomic carbon concentration is at least $1\times10^{19}$ cm$^{-3}$.

A structure provided in accordance with the disclosure includes a silicon substrate 26, a p-well region 22 within a first region of the substrate, and an arsenic-doped (or phosphorus-doped) n-well region 24 within a second region of the substrate. A plurality of first fins 34 are used to form pFET devices. Each first fin has a silicon germanium top region and an epitaxial carbon-doped silicon germanium region between the silicon germanium top region and the n-doped n-well 24. A plurality of parallel second fins 32 have silicon portions adjoining the p-well region 22. A dielectric layer 29 on the substrate 26 electrically isolates the first fins and the second fins. The epitaxial carbon-doped silicon germanium region of each fin is doped with arsenic in some embodiments, the arsenic decreasing in concentration in the direction of the silicon germanium top region.

Those skilled in the art will appreciate that the exemplary structures discussed above can be distributed in raw form or incorporated as parts of intermediate products or end products that benefit from having FinFET devices therein.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Terms such as "above" and "below" are used to indicate relative positioning of elements or structures to each other as opposed to relative elevation.

The corresponding structures, materials, acts, and equivalents of all means or step plus function elements in the claims below are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the various embodiments with various modifications as are suited to the particular use contemplated.

What is claimed is:

1. A method comprising:
   obtaining a first structure comprising a crystalline silicon substrate having an nFET region and a pFET region, a p-well region within the nFET region of the substrate and an n-well region within the pFET region of the substrate;
   forming a recess within the pFET region of the crystalline silicon substrate down to the n-well region;
   epitaxially growing a carbon-doped silicon germanium layer in the recess on the n-well region;
   epitaxially growing an essentially undoped silicon germanium layer in the recess on the carbon-doped silicon germanium layer, the carbon-doped silicon germanium layer having a higher percentage of germanium than is contained in the silicon germanium layer, the carbon-doped silicon germanium layer being positioned between the n-well and the silicon germanium layer;
   forming a plurality of parallel first fins from the block structure and the n-well region, each first fin comprising a silicon germanium portion from the silicon germanium layer, a carbon-doped silicon germanium portion from the carbon-doped silicon germanium layer, and an n-doped portion from part of the n-well region in the pFET region, and
   forming a plurality of parallel second fins comprising a silicon portion from the crystalline silicon substrate and a p-doped portion from the p-well region in the nFET region.

2. The method of claim 1, wherein the n-well region of the substrate is doped with arsenic.

3. The method of claim 2, further including the step of depositing a dielectric layer on the substrate and in areas between the first fins and second fins, thereby obtaining a second structure.

4. The method of claim 3, wherein the carbon-doped silicon germanium portions of the first fins include exposed portions extending above the dielectric layer.

5. The method of claim 3, wherein the step of growing the carbon-doped silicon germanium layer on the n-well region further includes in situ doping the carbon-doped silicon germanium layer with arsenic using an arsenic precursor and reducing the concentration of the arsenic precursor during the growth of the carbon-doped silicon germanium layer until completely removed, thereby creating an in situ doped graded SiGe:C(As) layer.

6. The method of claim 5, wherein the carbon-doped silicon germanium portions of the first fins include exposed portions that extend above the dielectric layer.

7. The method of claim 3, further including the step of thermally processing the second structure, wherein the carbon-doped silicon germanium portions of the first fins suppresses arsenic diffusion into the silicon germanium portions of the first fins.

8. The method of claim 7, further including the step of forming p-type FinFET devices in the pFET region using the first fins.

9. The method of claim 8, further including the step of forming n-type FinFET devices in the nFET region using the second fins.

10. The method of claim 1, wherein the steps of growing the carbon-doped silicon germanium layer and the silicon germanium layer cause the carbon-doped silicon germanium layer to have a one to five percent higher percentage of germanium than is contained in the silicon germanium layer.

11. The method of claim 10, wherein the step of growing the carbon-doped silicon germanium layer further includes causing the carbon-doped silicon germanium layer to have a composition of $Si_{1-x}Ge_x:C$ where x is at least 0.2 and an atomic carbon concentration of at least $1\times10^{19}$ cm$^{-3}$.

12. The method of claim 1, wherein the step of growing the carbon-doped silicon germanium layer further includes causing the carbon-doped silicon germanium layer to have a composition of $Si_{1-x}Ge_x$:C where x is at least 0.2.

13. The method of claim 12, wherein the step of growing the carbon-doped silicon germanium layer further includes causing the carbon-doped silicon germanium layer to have an atomic carbon concentration of at least $1\times10^{19}$ cm$^{-3}$.

14. The method of claim 13, wherein the n-well region of the substrate is doped with arsenic.

15. The method of claim 1, wherein the carbon-doped silicon layer has an atomic carbon concentration of between $1\times10^{19}$ cm$^{-3}$ and $2\times10^{20}$ cm$^{-3}$.

16. The method of claim 15, wherein the carbon-doped silicon germanium layer has a one to five percent greater percentage of germanium than the silicon germanium layer.

17. The method of claim 16, further including adding arsenic in situ in decreasing concentration during the epitaxial growth of the carbon-doped silicon germanium layer until addition of the arsenic is completely discontinued.

18. A method comprising:
obtaining a first structure comprising a crystalline silicon substrate having an nFET region and a pFET region, a p-well region within the nFET region of the substrate and an n-well region within the pFET region of the substrate;
forming a recess within the pFET region of the crystalline silicon substrate down to the n-well region;
epitaxially growing a carbon-doped silicon germanium layer in the recess on the n-well region while adding arsenic in situ in decreasing concentration during the epitaxial growth of the carbon-doped silicon germanium layer until addition of the arsenic is completely discontinued;
epitaxially growing an essentially undoped silicon germanium layer in the recess on the carbon-doped silicon germanium layer, the carbon-doped silicon germanium layer having the same or greater percentage of germanium as the silicon germanium layer, the carbon-doped silicon germanium layer being positioned between the n-well region and the silicon germanium layer;
forming a plurality of parallel first fins from the n-well region, the carbon-doped silicon germanium layer and the silicon germanium layer, each first fin comprising a silicon germanium portion from the silicon germanium layer, a carbon-doped silicon germanium portion from the carbon-doped silicon germanium layer, and an n-doped portion from part of the n-well region in the pFET region;
forming a plurality of parallel second fins comprising a silicon portion from the crystalline silicon substrate and a p-doped portion from the p-well region in the nFET region;
forming p-type FinFET devices in the pFET region using the first fins;
forming n-type FinFET devices in the nFET region using the second fins;
filling areas between the first fins and the second fins with a dielectric layer such that the carbon-doped silicon germanium portions of the first fins include exposed portions that extend partially above the dielectric layer.

19. The method of claim 18, wherein the carbon-doped silicon germanium layer has a greater percentage of germanium than the silicon germanium layer.

20. The method of claim 19, wherein the carbon-doped silicon layer has an atomic carbon concentration of between $1\times10^{19}$ cm$^{-3}$ and $2\times10^{20}$ cm$^{-3}$.

* * * * *